United States Patent

Katsumata et al.

[11] Patent Number: 5,945,637
[45] Date of Patent: Aug. 31, 1999

[54] TERMINAL ATTACHMENT STRUCTURE HAVING A CRADLE PORTION TO PREVENT TOTTERING OF THE TERMINAL

[75] Inventors: Makoto Katsumata; Toshiyuki Mori; Hitoshi Ushijima, all of Shizuoka-ken, Japan

[73] Assignee: Yazaki Corporation, Tokyo, Japan

[21] Appl. No.: 08/821,449

[22] Filed: Mar. 21, 1997

[30] Foreign Application Priority Data

Mar. 22, 1996 [JP] Japan .................. P 8-066371

[51] Int. Cl.⁶ ...................................... H01R 9/09
[52] U.S. Cl. .................. 174/267; 174/68.1; 439/62; 439/81; 361/789; 361/791
[58] Field of Search ........................... 174/267, 260, 174/261, 68.1; 361/785, 786, 787, 788, 789, 790, 791; 439/68, 59, 62, 876, 81

[56] References Cited

U.S. PATENT DOCUMENTS

| | | | |
|---|---|---|---|
| 4,392,181 | 7/1983 | Jabben | 361/761 |
| 4,423,920 | 1/1984 | Cooper et al. | 439/62 |
| 4,668,032 | 5/1987 | Bouvier et al. | 439/68 |
| 5,590,465 | 1/1997 | Santo | 29/884 |

FOREIGN PATENT DOCUMENTS 4-6172  1/1992  Japan .

*Primary Examiner*—Kristine Kincaid
*Assistant Examiner*—Kamand Cuneo
*Attorney, Agent, or Firm*—Finnegan, Henderson, Farabow, Garrett & Dunner, L.L.P.

[57] ABSTRACT

A terminal attachment structure includes a circuit assembly and a terminal attached to the circuit assembly. The circuit assembly has an insulating substrate and a circuit printed on the insulating substrate. The terminal is composed of a circuit-contact part, a connecting part to be connected with a mating terminal and a cradle part arranged between the circuit-contact part and the connecting part. When a force directing the insulating substrate is applied on the connecting part, the cradle part operates to receive the force. Accordingly, the circuit-contact part does not rise from the insulating substrate, so that tottering of the terminal against the circuit assembly can be prevented.

7 Claims, 4 Drawing Sheets

TERMINAL ATTACHMENT STRUCTURE HAVING A CRADLE PORTION TO PREVENT TOTTERING OF THE TERMINAL

BACKGROUND OF THE INVENTION

The present invention relates to a terminal to be attached to a circuit assembly comprising an insulating substrate on which a circuit is printed and it relates to a terminal attachment structure which makes it possible to attach the terminal to the circuit assembly.

Japanese Utility Model Publication (kokai) No. 4-6172 discloses one example of the conventional lead terminal attached to a substrate in order to connect a circuit on the substrate with a lead. The lead terminal has a columnar pin part formed on one side thereof, a lead terminal part formed on the other side and a fit part arranged between the pin part and the lead terminal part. The lead terminal part is provided with a V-shaped groove defined by opposing pointed edges. In fitting, by inserting a lead into the groove under pressure, an insulating cover of the lead is peeled by the pointed edges. In this state, since a core part of the lead comes into electrical contact with the pointed edges, a distal end of the lead can be connected with the lead terminal electrically.

In order to fix the so-constructed lead terminal on the substrate, the pin part of the lead terminal is firstly inserted into an attachment hole formed in the substrate, so that the fit part abuts on a periphery of the attachment hole. Thereafter, the pin part projecting from the back surface of the substrate is soldered with a circuit on the substrate. In this way, the attachment of the conventional lead terminal to the substrate can be completed.

Thus, in the conventional lead terminal, the above insertion of the lead into the V-shaped groove facilitates the electrical connection of the lead with the circuit in the substrate.

Beside the above-mentioned terminal structure, there is also known another terminal structure which can be attached to the substrate by means except soldering. This terminal structure is provided by bending an elongated conductive metal plates. The terminal structure comprises a circuit-contact part which is to be fitted to the insulating substrate so as to expose itself on one side of the insulating substrate and a connecting part which penetrates through the substrate and projects on another side thereof. The insulating substrate is provided, on the former side, with a circuit printed thereon and electrically connected with the terminal structure. In assembly, by connecting the connecting part of the terminal structure with a mating terminal, the circuit on the insulating substrate can be connected with the mating terminal.

Now, providing that the lead is inserted into the above-mentioned lead terminal on pressure in the former case or that the terminal structure is connected with the mating terminal in the latter case, any force for the substrate will be applied on the lead terminal or the terminal structure. Consequently, the pin part soldered with the substrate may become rickety in the former case, while the circuit-contact part may be lifted from the insulating substrate thereby to cause the terminal structure to be clattered in the latter case.

In the former case, even if the lead terminal totters against the substrate in this way, no problem would be caused because the lead has only to be fitted into the V-shaped groove. To the contrary, if the circuit-contact part of the latter terminal is raised from the insulating substrate unsteadily, it would be caused a problem that cracks are produced in the circuit formed on the circuit-contact part, so that the circuit is broken down.

SUMMARY OF THE INVENTION

It is therefore an object of the present invention to provide a terminal and a terminal attachment structure which is capable of preventing the terminal from tottering against a circuit assembly.

The object of the present invention described above can be accomplished by a terminal attachment structure comprising, in combination:
- a circuit assembly consisting of an insulating substrate and a circuit printed and formed on a surface of the insulating substrate;
- a terminal attached to the circuit assembly and connected with the circuit electrically;
- wherein the terminal comprising, under its attached condition to the circuit assembly:
  - a circuit-contact part interposed between the surface of the insulating substrate and the circuit to come in contact with the circuit;
  - a connecting part formed to project from the other surface of the insulating substrate and connected with a mating terminal; and
  - a cradle part arranged between the circuit-contact part and the connecting part for receiving a force applied on the connecting part toward the insulating substrate thereby to prevent the terminal from clattering with respect to the insulating substrate.

With the arrangement mentioned above, when a force directing the insulating substrate is applied on the connecting part, the cradle part operates to receive the force. Accordingly, since the force is not transmitted to the circuit-contact part, it does not rise from the insulating substrate, so that tottering of the terminal against the circuit assembly can be prevented.

In the present invention, preferably, the cradle part of the terminal attachment structure comprises:
- a cradle plate element which is arranged on the other surface of the substrate to support it together with the circuit-contact part; and
- a joint plate element for connecting the cradle plate element with the circuit-contact part.

In this case, when the force directing the insulating substrate is applied on the connecting part, the force is countered by an abutment of the cradle plate element against the insulating substrate. Thus, also in this case, since no force is applied on the circuit-contact part, it does not rise from the insulating substrate.

Alternatively, the connecting part may be arranged to penetrate the insulating substrate from the surface to the other surface, while the cradle part may be constituted by a projection which is formed so as to project from a portion of the connecting part toward the surface of the insulating substrate and which engages with the insulating substrate.

In this case, when the force directing the insulating substrate is applied on the connecting part, the force is countered by an engagement of the projection with the insulating substrate. Thus, also in this case, since no force is applied on the circuit-contact part, it does not rise from the insulating substrate, so that tottering of the terminal against the circuit assembly can be prevented.

More preferably, the circuit-contact part of the terminal is provided, at a leading end thereof, with a press fit projection which is fitted into the insulating substrate under pressure.

In this case, owing to fitting of the press fit projection at the leading end of the circuit-contact part into the insulating substrate under pressure, it is possible to securely fix the terminal on the insulating substrate in position without causing the tottering of the terminal against the insulating substrate.

In the present invention, preferably, the circuit assembly has an engagement recess formed on the surface so as to engage with the terminal while the circuit-contact part is exposed on the side of the surface of the insulating substrate.

In this case, owing to the engagement of the engagement recess with the terminal, it is possible to attach the terminal to the circuit assembly firmly.

More preferably, the circuit assembly has an engagement groove formed so as to engage with the press fit projection of the terminal.

Also in this case, it is possible to attach the terminal to the circuit assembly firmly.

Furthermore, according to the present invention, it is also provided a terminal for electrically connecting a circuit of a circuit assembly with a mating terminal, the terminal comprising:

a circuit-contact part for the circuit of the circuit assembly, the circuit-contact part being shaped in form of an elongated plate;

a cradle part joined to one end of the circuit-contact part; and a connecting part for the mating terminal, which is connected with the cradle part, the connecting part being shaped in form of an elongated plate.

In the present invention, it is preferable that the cradle part comprises a cradle plate element arranged in parallel with the circuit-contact part, and a joint plate element having one end connected with one end of the cradle plate element at right angle and having the other end connected with one end of the circuit-contact part at right angle, and the connecting part is joined to the other end of the cradle plate element at right angle.

Alternatively, the cradle part may comprise a projection.

In the present invention, more preferably, the circuit-contact part of the terminal is provided, at a leading end thereof, with a press fit projection.

These and other objects and features of the present invention will become more fully apparent from the following description and appended claims taken in conjunction with the accompany drawing.

BRIEF DESCRIPTION OF THE DRAWINGS

FIGS. 6A to 6C show step of attaching the terminal of the second embodiment to the circuit body, wherein FIG. 6A is a cross sectional view showing a condition before the terminal is attached to the insulating substrate; FIG. 6B is a cross sectional view showing a condition that the terminal is attached to the insulating substrate; and FIG. 6C is a cross sectional view showing a condition that a circuit is formed on the insulating substrate having the terminal attached thereto.

DESCRIPTION OF THE PREFERRED EMBODIMENT

Figure 1:
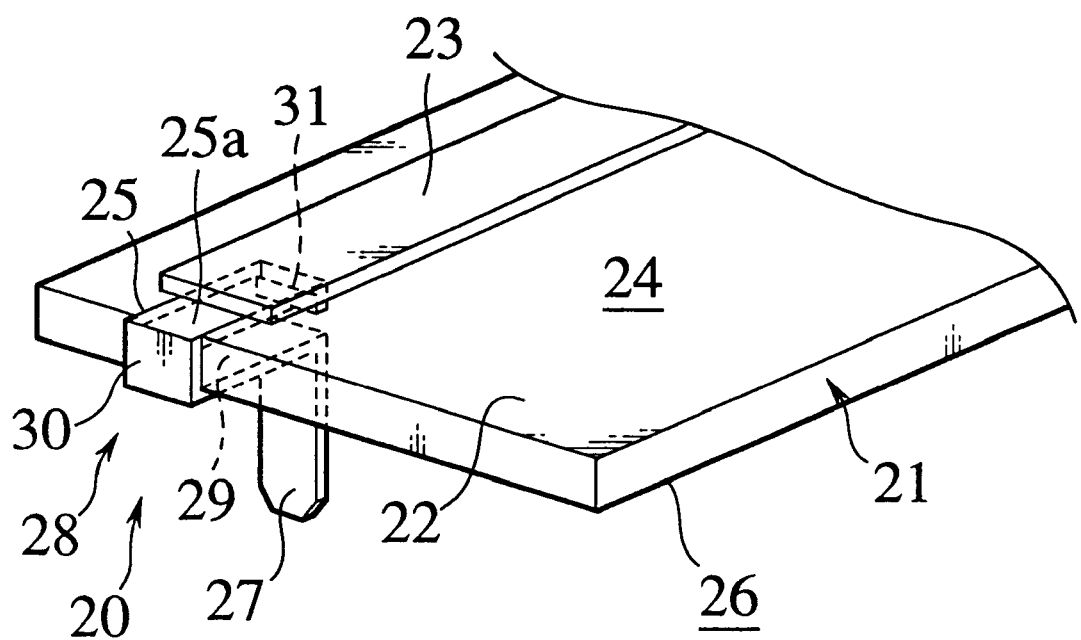
FIG. 1 is a perspective view of a terminal attachment structure consisting of a terminal and a circuit assembly in accordance with a first embodiment of the present invention.
Figure 2:
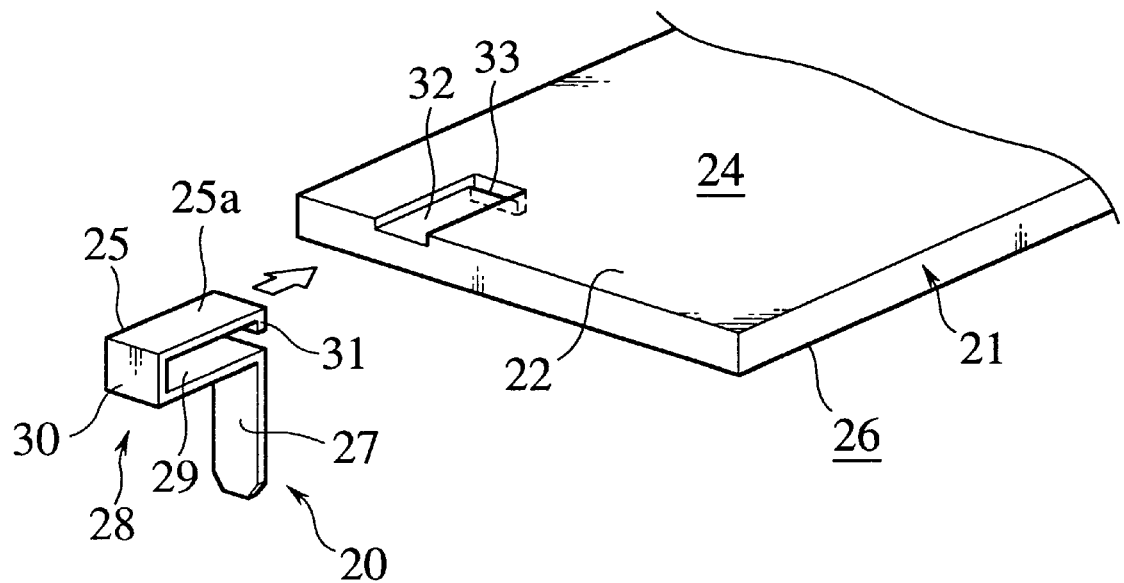
FIG. 2 is a perspective view showing a condition before the terminal is attached to the circuit body in the first embodiment.
Figure 3:
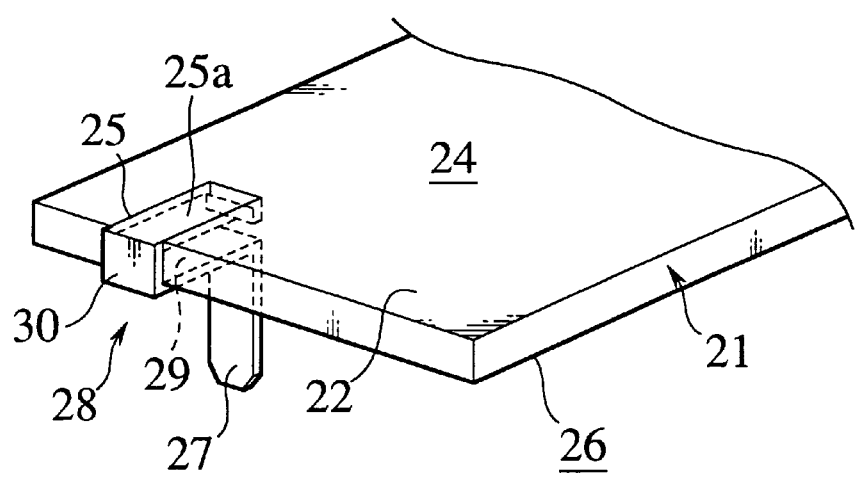
FIG. 3 is a perspective view showing a condition after the terminal is attached to the insulating substrate in the first embodiment.

Embodiments of the present invention will be described with reference to the drawings. In figures, FIGS. 1, 2 and 3 show a terminal 20 and its attachment structure to a circuit assembly 21, in accordance with the first embodiment of the invention.

The circuit assembly 21 to which the terminal 20 of the embodiment is to be attached is constituted by an insulating substrate 22 on which a circuit 23 is printed and formed. Note, the insulating substrate 22 is made of plastic material or the like, while the circuit 23 is composed of conductive paste or the like. As shown in FIG. 1, the terminal 20 of the embodiment comprises a circuit-contact part 25 interposed between a surface 24 of the insulating substrate 22 and the circuit 23 so as to come in contact with the circuit 23, a connecting part 27 arranged so as to project from the opposite surface 26 of the insulating substrate 22 and connect with a not-shown mating terminal, and a cradle part 28 disposed between the circuit-contact part 25 and the connecting part 27 to receive a force applied on the substrate 22 and prevent clattering of the terminal 20 with respect to the substrate 22. The cradle part 28 consists of a cradle plate element 29 and a joint plate element 30 for connecting the cradle plate element 29 with the circuit-contact part 25. The cradle plate element 29 is formed in parallel with the circuit-contact part 25 and disposed on the side of the surface 26 of the substrate 22. Therefore, the insulating substrate 22 is interposed between the circuit-contact part 25 and the cradle plate element 29.

The terminal 20 is produced by bending an elongated conductive plate material, providing a substantial U-shaped configuration by the circuit-contact part 25, the joint plate element 30 and the cradle plate element 29. The end portion of the cradle plate element 29 is bent at right angle to provide the connecting part 27. Furthermore, the end portion of the circuit-contact part 25 is also bent at right angle in the direction of the connecting part 27 thereby providing a press fit projection 31.

On the other hand, the circuit assembly 21 is provided, adjacent an outer edge thereof, with a fit or engagement recess 32 for engagement with the circuit-contact part 25 on condition that an exposing surface 25a thereof is exposed. In addition, at the end of the fit recess 32, a press fit or engagement groove 33 is formed for engagement with the press fit projection 31.

We now describe steps of attaching the terminal 20 to the insulating substrate 22 in order to electrically connect the circuit 23 of the circuit assembly 21 with the terminal 20.

After opposing the terminal 20 laterally to the insulating substrate 22 as shown in FIG. 2, the circuit-contact part 25 is fitted into the engagement recess 32 on the surface 24 of the substrate 22. Then, the cradle plate element 29 is also abutted against the other surface 26, so that the joint plate element 30 comes into contact with the side face of the insulating substrate 22, as shown in FIG. 3. Under such a condition, the side edge portion of the substrate 22 is interposed between the circuit-contact part 25 and the cradle plate element 29. Note that, the press fit projection 31 is inserted into the press fit groove 33 under pressure, simultaneously,.

After the engagement of the terminal 20 with the circuit assembly 21 is has been completed, the circuit 23 is printed on the surface 24 of the insulating substrate 22, as shown in FIG. 1. Simultaneously, the circuit 23 is also formed on an exposing face 25a of the circuit-contact part 25. In this way, the terminal 20 is electrically connected with the circuit 23.

The so-constructed terminal 20 operates as follows.

When the terminal 20 is subjected to a force which presses the connecting part 27 toward the insulating substrate 22, the cradle plate element 29 comes into contact with the other surface 26 of the insulating substrate 22. Thus, since the force is not transmitted to the circuit-contact part 25 directly, it would not be lifted from the engagement recess 32, so that clattering of the part 25 does not occur. In addition, owing to contact of the cradle plate element 20 with the insulating substrate 22, it is possible to prevent the terminal 20 from clattering with respect to the insulating substrate 22.

In this way, even if applying force directing to the insulating substrate 22 on the connecting part 27, the force is not exerted on the circuit-contact part 25 due to a contact of the cradle plate element 29 with the other surface 26 of the insulating substrate 22, so that the part 25 is nor raised from the engagement recess 32. Therefore, since no force is applied on the circuit 23 formed on the surface 24 of the insulating substrate 22, any crack is not generated in the circuit 23, so that the damage thereon can be prevented certainly.

In addition, since the press fit projection 31 at the end of the circuit-contact part 25 is fitted into the press fit groove 33 of the insulating substrate 22 under pressure, the arrangement also makes it possible to prevent the terminal 20 from clattering against the insulating substrate 22.

The second embodiment of the invention will be described hereinafter with reference to FIGS. 4, 5 and 6. Note, in the embodiment, elements similar to those of the first embodiment are indicated with the same reference numerals, respectively and repetitive descriptions are deleted.

A terminal 35 of the embodiment comprises a connecting part 36 penetrating the insulating substrate 22 from the side of the surface 24 to the other side of the surface 26 and a cradle part 38 consisting of a projection 38 projecting from a portion of the part 36, which is embedded in the insulating substrate 22, toward the surface 24.

Thus, it will be understood that the terminal 35 of the embodiment is attached to the interior side of the circuit assembly 21 so as to penetrate it while the terminal 20 of the first embodiment is attached to the exterior side of the circuit assembly 21.

Figure 4:
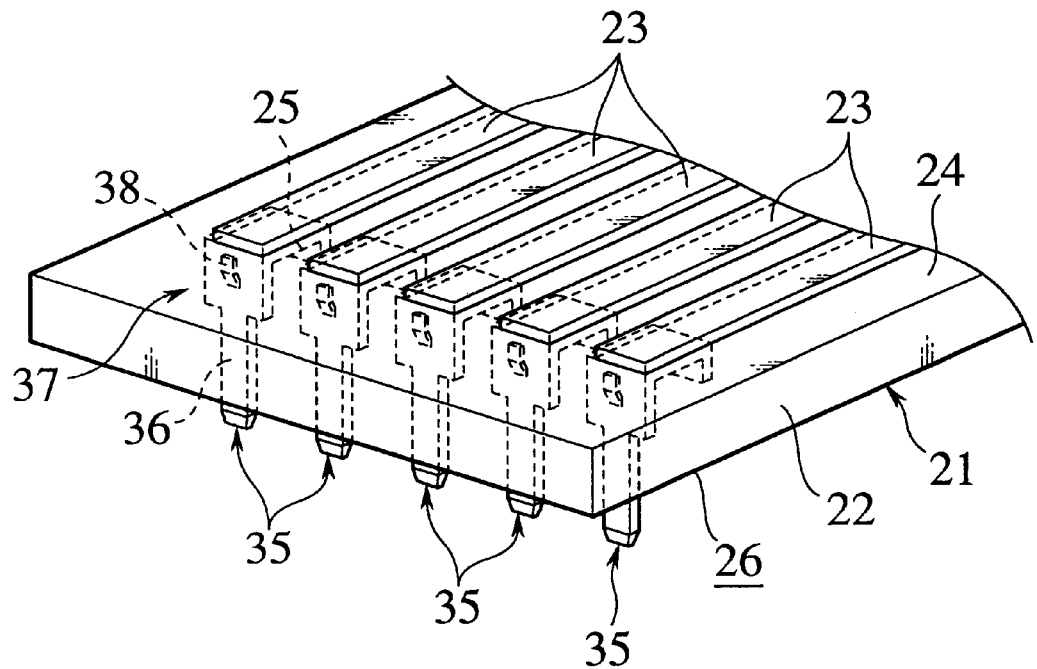
Fig. 4 is a perspective view of a terminal attachment structure of the terminal to the circuit body in accordance with a second embodiment of the present invention.
Figure 5:
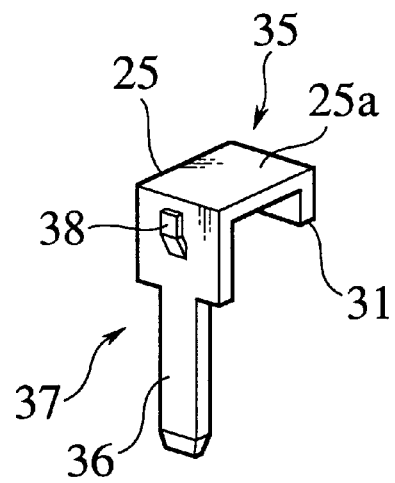
FIG. 5 is a perspective view of the terminal of the second embodiment.

As shown in FIGS. 4 and 5, the circuit-contact part 25 of the terminal 35 is partially bent at right angle, providing the connecting part 36. The connecting part 36 consists of a wide portion having a width equal to that of the circuit-contact part 25 and a narrow portion integrated with the wide portion. The projection 38 is formed on the wide portion of the connecting part 36 to project toward the circuit-contact part 25.

Figure 6A:
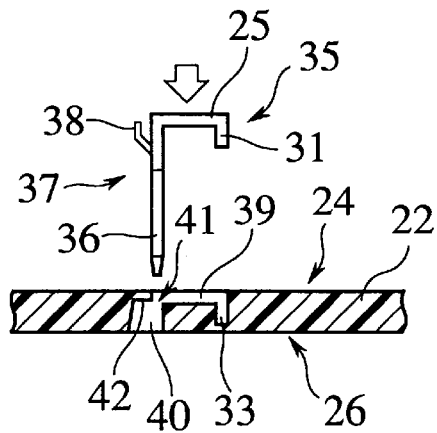

While, as shown in FIG. 6A, the insulating substrate 22 is provided, on the side of the surface 24, with an engagement recess 39 and a press fit groove 33 which is arranged on one side of the engagement recess 39. On the other side of the engagement recess 33, a through hole 40 is formed so as to penetrate the insulating substrate 22. In the through hole 40, a step part 41 is formed to have an engagement wall 42 opposing the surface 26. Under condition that the terminal 35 is fitted into the recess 39, the projection 38 engages with the engagement wall 42.

In order to attach the terminal 35 to the circuit assembly 21, the connecting part 36 is inserted into the through hole 40 and the circuit-contact part 25 is fitted into the engagement recess 39 while the press fit projection 31 is inserted into the press fit groove 31, as shown in FIG. 6A. During fitting of the terminal 35, the projection 38 is bent due to its abutment with an edge of the through hole 40 in a moment.

Figure 6B:
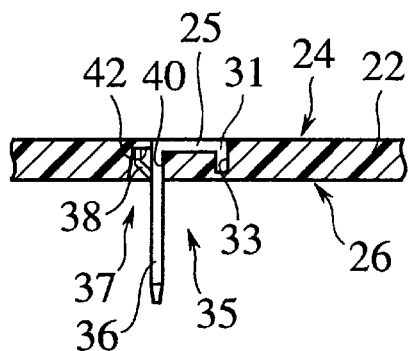

Thereafter, when the projection 38 surmounts the edge of the through hole 40, the projection 38 returns to its original position in the hole 40, as shown in FIG. 6B. In this state, the leading end of the projection 38 abuts on the engagement wall 42.

Figure 6C:
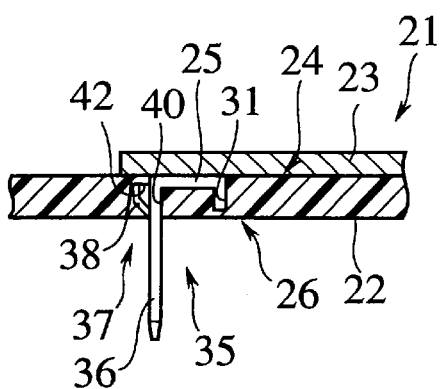

Next, as shown in FIG. 6C, the circuit 23 is printed on the surface 24 of the insulating substrate 22, including the surface 25a of the circuit-contact part 25. In this way, the terminal 35 can be attached to the circuit assembly 21 while being electrically connected with the circuit 23.

The terminal 35 of the embodiment operates as follows.

When the terminal 35 is subjected to a force which presses the connecting part 36 toward the insulating substrate 22, the projection 38 comes into contact with the engagement wall 42. Thus, since the force is not transmitted to the circuit-contact part 25 directly, it would not be lifted from the engagement recess 39, so that clattering of the part 25 does not occur, whereby the circuit 29 can be protected without being damaged.

Finally, it will be understood by those skilled in the art that the foregoing description is one of preferred embodiments of the disclosed terminal attachment structure, and that various changes and modifications may be made to the present invention without departing from the spirit and scope thereof.

What is claimed is:

1. A terminal attaching structure comprising:

A circuit assembly including an insulating substrate and a circuit printed and formed on a surface of the insulating substrate;

a terminal attached to the circuit assembly and connected with the circuit electrically, the terminal comprising:

a circuit-contact part interposed between the surface of the insulating substrate and the circuit;

a connecting part projecting from a back surface of the insulating substrate, opposite to the surface of the insulating substrate, and connectable with a mating terminal; and a cradle part arranged between the circuit-contact part and the connecting part for receiving a force applied on the connecting part toward the insulating substrate thereby to prevent the terminal from clattering with respect to the insulating substrate, the cradle part comprising:

a cradle plate element arranged on the back surface of the substrate to support the substrate together with the circuit-contact part; and a joint plate element for connecting the cradle plate element with the circuit-contact part.

2. A terminal attachment structure as claimed in claim 1, wherein the circuit-contact part of the terminal is provided, at a leading end thereof, with a press fit projection fitted into the insulating substrate under pressure.

3. A terminal attachment structure as claimed in claim 2, wherein the circuit assembly is provided, on the surface of the insulating substrate, with an engagement recess for engagement with the terminal, which is so formed as to expose the circuit-contact part of the terminal on the surface of the insulating substrate.

4. A terminal attachment structure as claimed in claim 3, wherein the circuit assembly has an engagement groove formed so as to engage with the press fit projection of the terminal.

5. A terminal attachment structure comprising:

a circuit assembly including an insulating substrate and a circuit printed and formed on a surface of the insulating substrate;

a terminal attached to the circuit assembly and connected with the circuit electrically, the terminal comprising:
  a circuit-contact part interposed between the surface of the insulating substrate and the circuit, the circuit-contact part of the terminal having, at a leading end thereof, a press fit projection fitted into the insulating substrate under pressure;
  a connecting part projecting from a back surface of the insulating substrate, opposite to the surface of the insulating substrate, and connectable with a mating terminal; and
  a cradle part arranged between the circuit-contact part and the connecting part to receive a force applied on the connecting part toward the insulating substrate thereby preventing the terminal from clattering with respect to the insulating substrate, the cradle part comprising:
    a cradle plate element arranged on the back surface of the insulating substrate.

6. A terminal attachment structure as claimed in claim 5, wherein the circuit assembly is provided, on the surface of the insulating substrate, with an engagement recess for engagement with the terminal, which is so formed as to expose the circuit-contact part of the terminal on the surface of the insulating substrate.

7. A terminal attachment structure as claimed in claim 6, wherein the circuit assembly has an engagement groove formed so as to engage with the press fit projection of the terminal.

* * * * *